(12) United States Patent
Chen et al.

(10) Patent No.: US 8,916,475 B1
(45) Date of Patent: Dec. 23, 2014

(54) PATTERNING METHOD

(71) Applicant: United Microelectronics Corp., Hsinchu (TW)

(72) Inventors: Chieh-Te Chen, Kaohsiung (TW); Feng-Yi Chang, Tainan (TW); Hsuan-Hsu Chen, Tainan (TW); Cheng-Hsing Chuang, Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/070,262

(22) Filed: Nov. 1, 2013

(51) Int. Cl.
*H01L 21/311* (2006.01)
*H01L 21/308* (2006.01)

(52) U.S. Cl.
CPC ........ *H01L 21/3085* (2013.01); *H01L 21/3081* (2013.01); *H01L 21/3088* (2013.01)
USPC .......................................... 438/703; 438/700

(58) Field of Classification Search
USPC .......... 438/700, 702, 703, 737, 945, 950, 952
See application file for complete search history.

(56) References Cited

U.S. PATENT DOCUMENTS

| | | | |
|---|---|---|---|
| 7,709,275 B2 | 5/2010 | Yang et al. | |
| 7,767,587 B2 * | 8/2010 | Fuller et al. | 438/740 |
| 7,799,511 B2 | 9/2010 | Chou et al. | |
| 8,816,328 B2 * | 8/2014 | Chang et al. | 257/24 |
| 2007/0020565 A1 | 1/2007 | Koh et al. | |
| 2012/0276747 A1 * | 11/2012 | Oh et al. | 438/717 |
| 2014/0170853 A1 * | 6/2014 | Shamma et al. | 438/699 |
| 2014/0235035 A1 * | 8/2014 | Stranzl et al. | 438/462 |

* cited by examiner

*Primary Examiner* — Kevin M Picardat
(74) *Attorney, Agent, or Firm* — J.C. Patents

(57) ABSTRACT

A patterning method is provided. A mask composite layer and a first tri-layer photoresist are sequentially formed on a target layer. A first etching is performed to the mask composite layer, using the first tri-layer photoresist as a mask, to form at least one first opening in an upper portion of the mask composite layer. The first tri-layer photoresist is removed. A second tri-layer photoresist is formed on the mask composite layer. A second etching is performed to the mask composite layer, using the second tri-layer photoresist as a mask, to form at least one second opening in the upper portion of the mask composite layer. The second tri-layer photoresist is removed. A lower portion of the mask composite layer is patterned by using the upper portion of the mask composite layer as a mask. The target layer is patterned by using the patterned mask composite layer as a mask.

17 Claims, 5 Drawing Sheets

PATTERNING METHOD

BACKGROUND OF THE INVENTION

1. Field of Invention

The present invention relates to an integrated circuit (IC) fabrication, and particularly to a patterning method.

2. Description of Related Art

As the level of integration of integrated circuits is getting increased, the demand for increasing the feature density or reducing the pitch size becomes the mainstream in the semiconductor industry, and the key technology is in photolithography.

However, when the pitch size is beyond the photolithography resolution, a single exposure step is no longer applicable due to the pitch constraint. The pattern decomposition (or called "pattern split" or "double patterning") technique is accordingly developed to meet the process requirements. After the target pattern is decomposed into two patterns respectively defined on two photomasks, the 2P2E (photo-etch-photo-etch) approach utilizing two photolithography steps and two etching steps is implemented.

In the case that the first photolithography step and the first etching step are completed and the second photolithography step has to be removed for rework, a portion of components (e.g. SiGe source/drains) exposed after the first etching step may be damaged during the rework, and the device performance may be therefore deteriorated.

SUMMARY OF THE INVENTION

The present invention provides a patterning method, in which SiGe loss does not occur during the rework of the second photolithography step of the 2P2E approach, so that the device performance can be accordingly improved.

The present invention provides a patterning method. A mask composite layer and a first tri-layer photoresist are sequentially formed on a target layer, wherein the mask composite layer includes, from bottom to top, an amorphous carbon layer, a first mask layer and a second mask layer, and an etching selectivity of the second mask layer is different from an etching selectivity of the first mask layer. A first etching process is performed to the mask composite layer by using the first tri-layer photoresist as a mask, so as to form at least one first opening pattern in the second mask layer of the mask composite layer. The first tri-layer photoresist is removed. A second tri-layer photoresist is formed on the mask composite layer. A second etching process is performed to the mask composite layer by using the second tri-layer photoresist as a mask, so as to form at least one second opening pattern in the second mask layer of the mask composite layer. The second tri-layer photoresist is removed. The amorphous carbon layer and the first mask layer are patterned by using the second mask layer as a mask, so as to form a patterned mask composite layer. The target layer is patterned by using the patterned mask composite layer as a mask.

According to an embodiment of the present invention, the target layer is a dielectric layer formed on a substrate covering a plurality of gate structures.

According to an embodiment of the present invention, the step of patterning the target layer exposes a portion of source/drain regions between the gate structures.

According to an embodiment of the present invention, the source/drain regions include SiGe.

According to an embodiment of the present invention, the substrate is a bulk substrate.

According to an embodiment of the present invention, the substrate is a substrate with fins extending in a first direction, and the gate structures cross the fins and extend in a second direction different from the first direction.

According to an embodiment of the present invention, the second direction is perpendicular to the first direction.

According to an embodiment of the present invention, the first tri-layer photoresist is the same as the second tri-layer photoresist.

According to an embodiment of the present invention, each of the first and second tri-layer photoresists includes, from bottom to top, a lower photoresist, a Si-containing hard-mask bottom anti-reflection coating (SHB) layer and an upper photoresist.

According to an embodiment of the present invention, each of the lower photoresist and the upper photoresist includes a 436 nm photoresist, a 405 nm photoresist, a 365 nm photoresist, a 248 nm photoresist or a 193 nm photoresist.

According to an embodiment of the present invention, the lower photoresist includes a 365 nm photoresist, and the upper photoresist includes a 193 nm photoresist.

According to an embodiment of the present invention, the SHB layer includes organosilicon polymer or polysilane.

According to an embodiment of the present invention, the first mask layer includes silicon nitride and the second mask layer includes silicon oxide.

According to an embodiment of the present invention, the first mask layer includes silicon oxide and the second mask layer includes silicon nitride.

According to an embodiment of the present invention, the step of patterning the amorphous carbon layer and the first mask layer and the step of patterning the target layer are preformed in the same process chamber.

According to an embodiment of the present invention, the target layer includes silicon oxide, silicon nitride, silicon oxynitride, polysilicon, metal or a combination thereof.

In view of the above, in the patterning method of the invention, a tri-layer hard mask and two tri-layer photoresists are provided for patterning the target layer. With such method, the required patterns (e.g. contact holes) can be easily defined. Even though a rework of the second photolithography step occurs, such film stack can provide enough protection for the underlying layers. Therefore, the conventional SiGe loss during the rework of the second photolithography step is not observed, so that the device performance can be accordingly improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
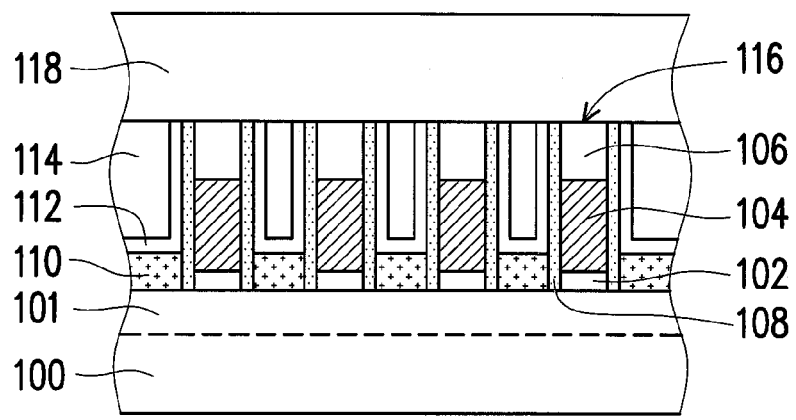
FIG. 1A to FIG. 1H schematically illustrate cross-sectional views of a patterning method according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

First Embodiment

FIG. 1A to FIG. 1H schematically illustrate cross-sectional views of a patterning method according to a first embodiment of the present invention.

Referring to FIG. 1A, a semiconductor substrate 100 having multiple gate structures 116 is provided. The semiconductor substrate can be a silicon-containing substrate 100 with multiple fins 101 extending in a first direction. An insulating layer (not shown) is formed to fill the lower portions of gaps between the fins 101. The insulating layer includes silicon oxide.

The gate structures 116 cross the fins 101 and extend in a second direction different from the first direction. In an embodiment, the second direction is perpendicular to the first direction. Each gate structure 116 includes an interfacial layer 102, a gate 104 and an optional cap layer 106 sequentially formed on the substrate 100. The interfacial layer 102 includes silicon oxide, silicon oxynitride, a high-k material with a dielectric constant greater than 4, or a combination thereof. The high-k material can be metal oxide, such as rare earth metal oxide. The high-k material can be selected from the group consisting of hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate, ($SrBi_2Ta_2O_9$, SBT), lead zirconate titanate ($PbZr_xTi_{1-x}O_3$, PZT), and barium strontium titanate ($Ba_xSr_{1-x}TiO_3$, BST), wherein x is between 0 and 1. The gate 104 can be a metal gate. The metal gate includes Al or W. The cap layer 106 includes silicon oxide, silicon nitride or a combination thereof.

Still referring to FIG. 1A, each gate structure 116 further includes a spacer 108 and source/drain regions 110. The spacer 108 is formed on the sidewall of the corresponding gate 104. The spacers 108 include silicon oxide, silicon nitride or a combination thereof. The source/drain regions 110 are formed on the fins 101 between the gate structures 116, and two adjacent gate structures 116 share one source/drain 110. Besides, the source/drain regions 110 cover the lower sidewalls of the spacers 108. In this embodiment, the source/drain regions 110 can be combination of P-type doped regions and SiGe layers, but the present invention is not limited thereto. In another embodiment, the source/drain regions 110 can be combination of N-type doped regions and SiC or SiP layers. The SiGe or SiC layers are formed with a selective epitaxy growth (SEG) process. The P-type or N-type doped regions are formed with an ion implantation process.

The embodiment of FIG. 1A in which each of the interfacial layer 102, the gate 104, the cap layer 106 and the spacer 108 is illustrated as a single-layer structure, but the present invention is not limited thereto. It should be appreciated by persons having ordinary skill in the art that each of the said components can be a composite layer or a multi-layer structure upon the process requirements.

Continue referring to FIG. 1A, the substrate 100 further has a contact etch stop layer (CESL) 112, a dielectric layer 114, and a dielectric layer 118 formed thereon. The CESL 112 and the dielectric layer 114 fill up the gaps between the gate structures 116 but expose the tops of the gate structures 116. Specifically, the CESL 112 is formed to cover the top surfaces of the source/drain regions 110 and the spacers 108 exposed by the source/drain regions 110, and the dielectric layer 114 is formed on the CESL 112 to fill up the gaps between the gate structures 116. Besides, the dielectric layer 118 is formed to cover the tops of the gate structures 116. The CESL 112 includes silicon nitride or a suitable insulating material. Each of the dielectric layer 114 and the dielectric layer 118 includes silicon oxide, a low-k material, a suitable insulating material or a combination thereof. The material of the dielectric layer 114 can be the same as or different from that of the dielectric layer 118.

Figure 1B:
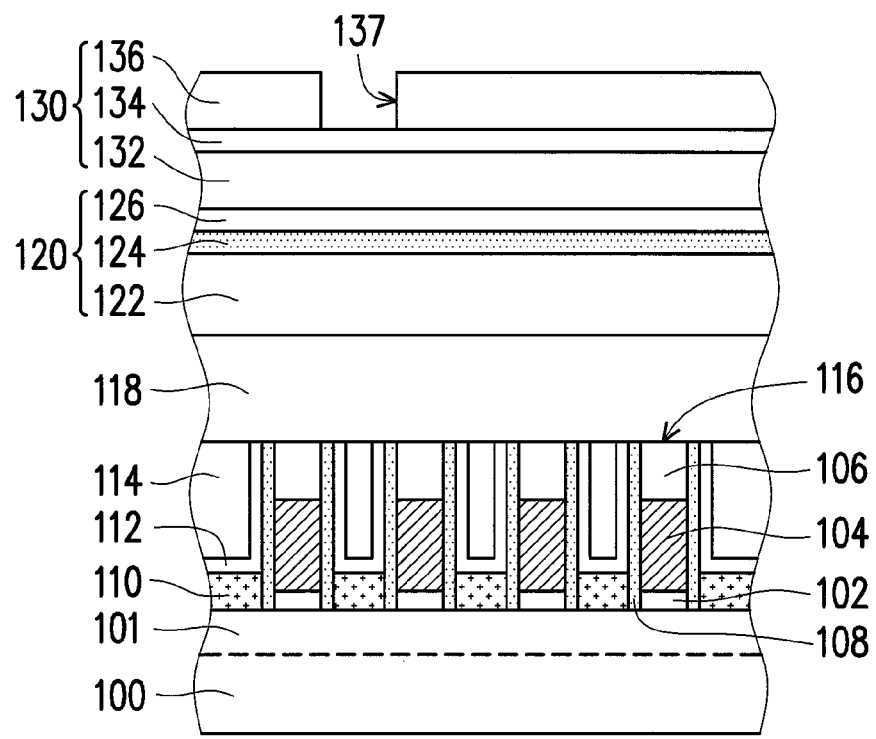

Referring to FIG. 1B, a mask composite layer 120 and a first tri-layer photoresist 130 are sequentially formed on the dielectric layer 118. The mask composite layer 120 includes, from bottom to top, an amorphous carbon layer 122, a first mask layer 124 and a second mask layer 126. The etching selectivity of the second mask layer 126 is different from that of the first mask layer 124. In this embodiment, the second mask layer 126 includes silicon oxide for providing good adhesion to the first tri-layer photoresist 130, and the first mask layer 124 includes silicon nitride with a different etching selectivity from that of silicon oxide. However, the present invention is not limited thereto. In another embodiment, the second mask layer 126 includes silicon nitride, and the first mask layer 124 includes silicon oxide. The method of forming each of the amorphous carbon layer 122, the first mask layer 124 and the second mask layer 126 includes performing a deposition process such as chemical vapour deposition (CVD), physical vapour deposition (PVD) or atomic layer deposition (ALD).

The first tri-layer photoresist 130 includes, from bottom to top, a lower photoresist 132, a Si-containing hard-mask bottom anti-reflection coating (SHB) layer 134 and an upper photoresist 136. Each of the upper photoresist 136 and the lower photoresist 132 includes a 436 nm (G-line) photoresist, a 405 nm (H-line) photoresist, a 365 nm photoresist, a 248 nm (KrF) photoresist or a 193 nm (ArF) photoresist. Besides, the upper photoresist 136 has a photolithography resolution better than that of the lower photoresist 132. For example, the upper photoresist 136 includes a 193 nm (ArF) photoresist, and the lower photoresist 132 includes a 365 nm (I-line) photoresist. The SHB layer 134 includes organosilicon polymer or polysilane. The method of forming each of the lower photoresist 132 and the SHB layer 134 includes performing a coating process. In this embodiment, the upper photoresist 136 has at least one opening pattern 137 therein. The method of forming the upper photoresist 136 includes performing a first photolithography process with a first photomask.

Figure 1C:
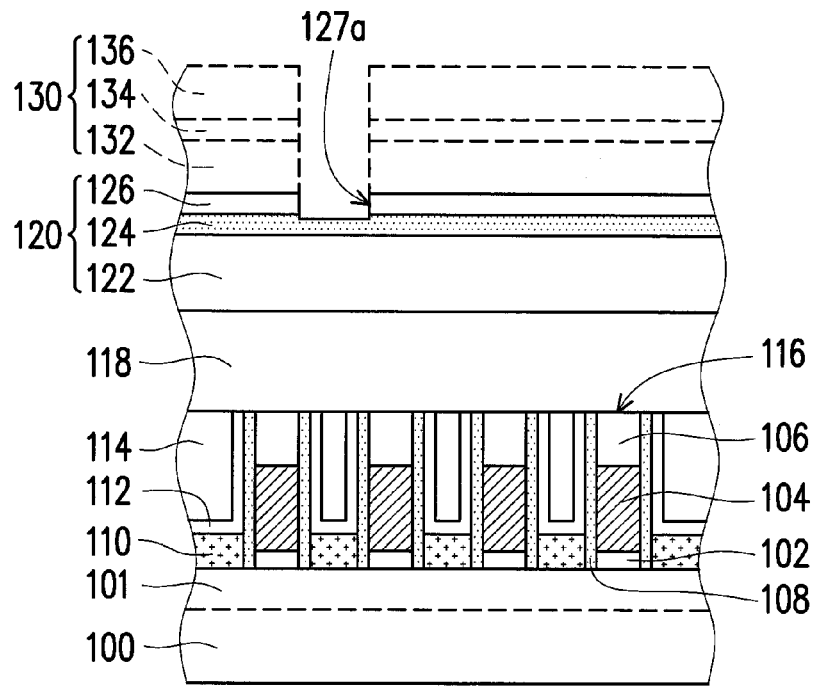

Referring to FIG. 1C, a first etching process is performed to the mask composite layer 120 by using the first tri-layer photoresist 130 as a mask. The first etching process such as a dry etching process transforms the opening pattern 137 of the upper photoresist 136 to the underlying layers, and therefore at least one opening pattern 127a corresponding to the opening pattern 137 is formed in the second mask layer 126 of the mask composite layer 120.

Thereafter, the first tri-layer photoresist 130 is removed. The removing step includes a dry etching, a wet etching, a cleaning or a combination thereof.

Figure 1D:
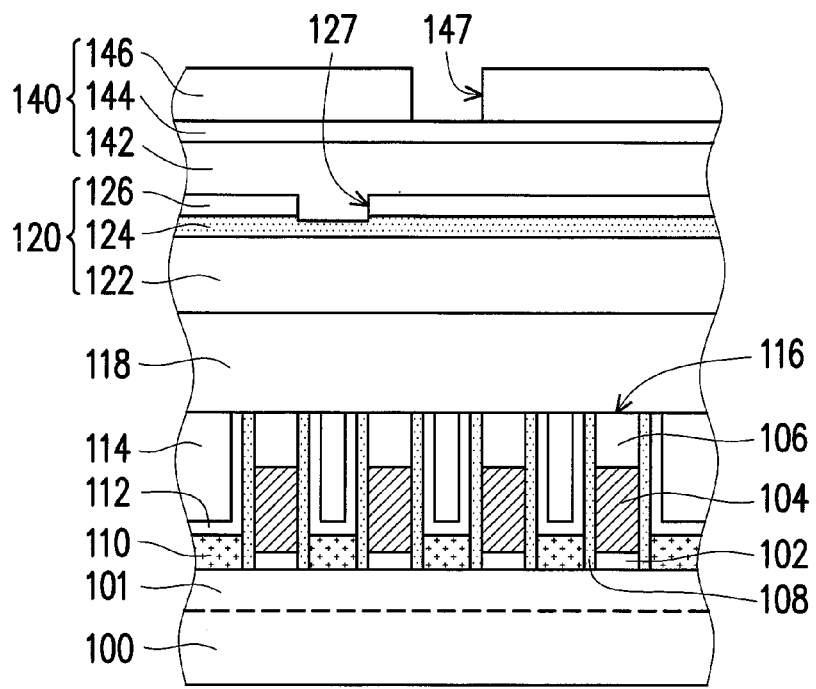

Referring to FIG. 1D, a second tri-layer photoresist 140 is formed on the mask composite layer 120. The second tri-layer photoresist 140 includes, from bottom to top, a lower photoresist 142, a SHB layer 144 and an upper photoresist 146, wherein the lower photoresist 142 fills in the opening pattern 127a of the second mask layer 126. Each of the upper photoresist 146 and the lower photoresist 142 includes a 436 nm (G-line) photoresist, a 405 nm (H-line) photoresist, a 365 nm (I-line) photoresist, a 248 nm (KrF) photoresist or a 193 nm (ArF) photoresist. Besides, the upper photoresist 146 has a photolithography resolution better than that of the lower photoresist 142. For example, the upper photoresist 146 includes a 193 nm (ArF) photoresist, and the lower photoresist 142 includes a 365 nm (I-line) photoresist. The SHB layer 144 includes organosilicon polymer or polysilane. The method of forming each of the lower photoresist 142 and the SHB layer 144 includes performing a coating process. In this embodiment, the upper photoresist 146 has at least one opening pattern 147 therein. The method of forming the upper photoresist 146 includes performing a second photolithography process with a second photomask.

In this embodiment, the first tri-layer photoresist 130 is the same as the second tri-layer photoresist 140, wherein each of the lower photoresists 132 and 142 is a 365 nm photoresist and each of the upper photoresists 136 and 146 is a 193 nm photoresist. However, the present invention is not limited thereto. In another embodiment, the first tri-layer photoresist 130 can be different from the second tri-layer photoresist 140 upon the process requirements. For example, the lower photoresist 132 is different from the lower photoresist 142 and the upper photoresist 136 is different from the upper photoresist 146; the lower photoresist 132 is the same as the lower photoresist 142 while the upper photoresist 136 is different from the upper photoresist 146; or the lower photoresist 132 is different from the lower photoresist 142 while the upper photoresist 136 is the same as the upper photoresist 146.

Herein, once a problem (e.g. particles, misalignment, dimension variation, machine down etc.) occurs in the second photolithography process, it is required to remove the problematic second tri-layer photoresist and form another second tri-layer photoresist (or called "rework"). For the conventional 2P2E approach, a portion of components (e.g. SiGe source/drains) are exposed after the first etching step and may be damaged during the rework. However, such component damage is not observed during the rework of the present invention. Specifically, in the present invention, all the components (including the SiGe source/drains 110, gate structures 116 etc.) are protected at least by the amorphous carbon layer 122 and the first mask layer 124 after the first etching step, and therefore free of any possible damage during the rework.

Figure 1E:
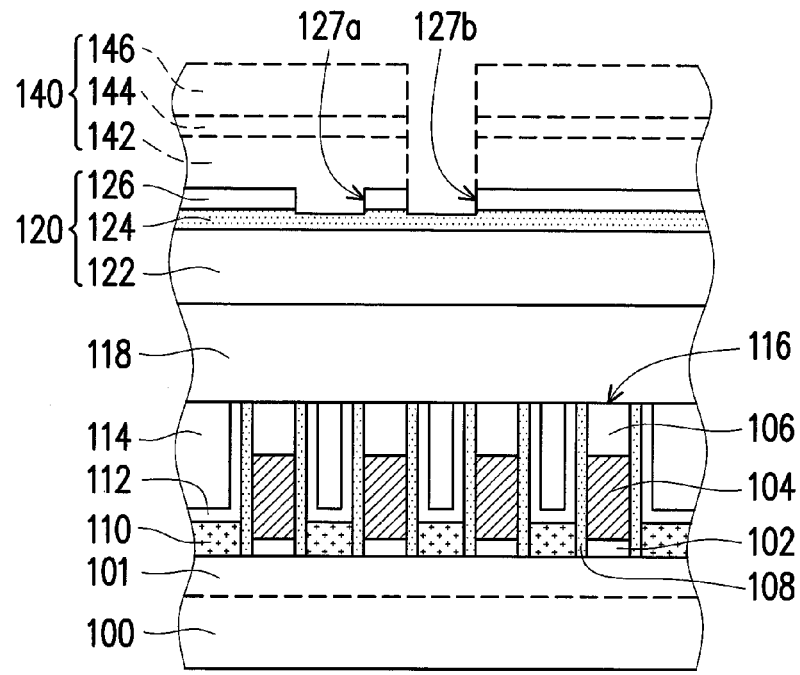

Referring to FIG. 1E, a second etching process is performed to the mask composite layer 120 by using the second tri-layer photoresist 140 as a mask. The second etching process such as a dry etching process transforms the opening pattern 147 of the upper photoresist 146 to the underlying layers, and therefore at least one opening pattern 127b corresponding to the opening pattern 147 is formed in the second mask layer 126 of the mask composite layer 120.

Thereafter, the second tri-layer photoresist 140 is removed. The removing step includes a dry etching, a wet etching, a cleaning or a combination thereof.

Figure 1F:
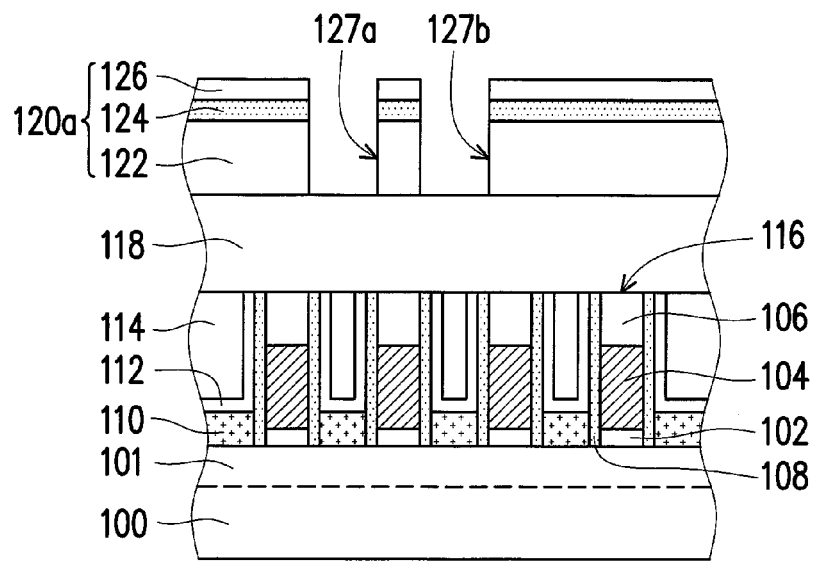

Referring to FIG. 1F, the amorphous carbon layer 122 and the first mask layer 124 are patterned by using the second mask layer 126 as a mask. Specifically, the patterning step transforms the opening patterns 127a and 127b of the second mask layer 126 to the underlying amorphous carbon layer 122 and the first mask layer 124, so as to form a patterned mask composite layer 120a. The patterning step includes performing a dry etching process.

Figure 1G:
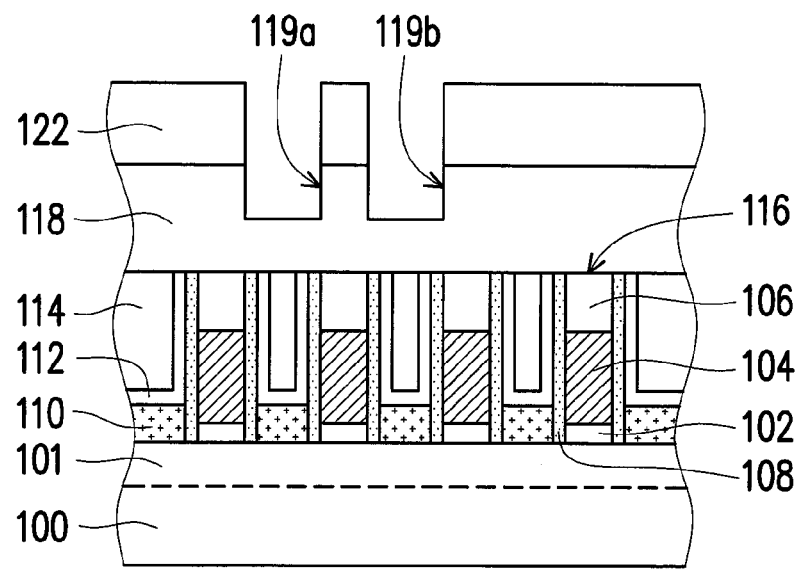
Figure 1H:
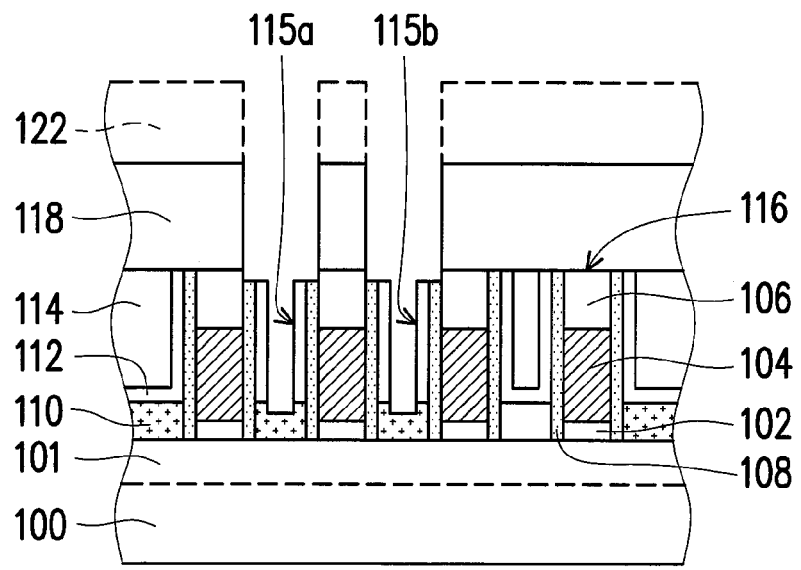

Referring to FIG. 1G and FIG. 1H, the dielectric layers 118 and 114 are patterned by using the patterned mask composite layer 120a as a mask. The patterning step includes two sub-steps. First, referring to FIG. 1G, a first sub-step such as a dry etching is performed to remove the first mask layer 124 and the patterned second mask layer 126 of the patterned mask composite layer 120a, and simultaneously form opening patterns 119a and 119b corresponding to the opening patterns 127a and 127b in the dielectric layer 118. In this embodiment, the opening patterns 119a and 119b do not penetrate the dielectric layer 118. Thereafter, referring to FIG. 1H, a second sub-step such as a dry etching is performed to remove a portion of the dielectric layer 118, the dielectric layer 114, and the CESL 112 and therefore form contact holes 115a and 115b corresponding to the opening patterns 119a and 119b in the dielectric layer 114. The contact holes 115a and 115b expose a portion of the SiGe source/drain regions 110 between the gate structures 116. Herein, the patterning step in FIG. 1G and FIG. 1H is performed by using the patterned mask composite layer 120a as an etching mask, so it can be considered as a self-aligned contact (SAC) etching process. Afterwards, the amorphous carbon layer 122 is removed with a dry etching.

The following steps after the removal of the amorphous carbon layer 122 includes forming contact plugs within the contact holes 115a and 115b, forming interconnections etc. These steps are well-known to people having ordinary skill in the art and are not iterated herein.

Besides, the step of patterning the amorphous carbon layer 122 and the first mask layer 124 (as shown in FIG. 1F) and the step of patterning the target layer (as shown in FIGS. 1G and 1H) can be preformed in the same process chamber, so that the queue-time can be reduced and the production cost can be saved.

The first embodiment in which the described method is applied to form a Fin Field-Effect Transistor (FinFET) device is provided for illustration purposes, and is not construed as limiting the present invention. It is appreciated by people having ordinary skill in the art that the described method can be applied to form a planar device including a metal gate or a silicon-containing gate.

Second Embodiment

Figure 2:
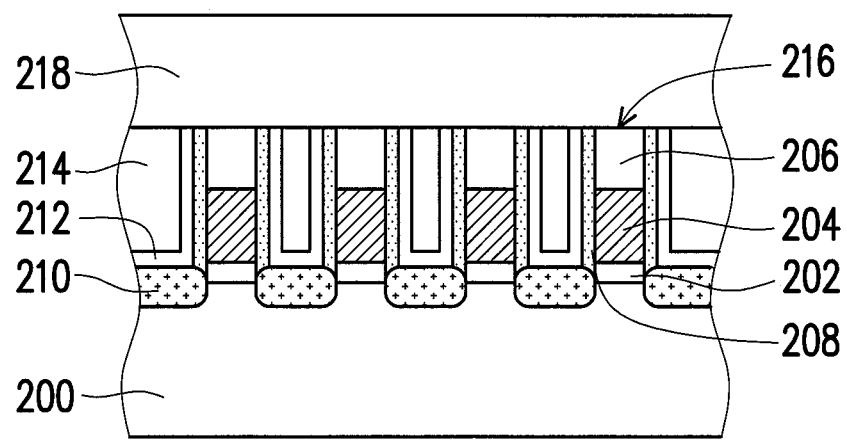
FIG. 2 schematically illustrates a cross-sectional view of a patterning method according to a second embodiment of the present invention.

FIG. 2 schematically illustrates a cross-sectional view of a patterning method according to a second embodiment of the present invention.

Referring to FIG. 2, a semiconductor substrate having multiple gate structures 216 is provided. The semiconductor substrate can be a bulk silicon-containing substrate 200 with shallow trench isolation (STI) structures (not shown) formed therein. Each gate structure 216 includes an interfacial layer 202, a gate 204 and an optional cap layer 206 sequentially formed on the substrate 200. The interfacial layer 202 includes silicon oxide, silicon oxynitride, a high-k material with a dielectric constant greater than 4, or a combination thereof. The high-k material can be metal oxide, such as rare earth metal oxide. The gate 204 can be a metal gate or a silicon-containing gate. The metal gate includes Al or W. The silicon-containing gate includes polysilicon, amorphous silicon or a combination thereof. The cap layer 206 includes silicon oxide, silicon nitride or a combination thereof.

Still referring to FIG. 2, each gate structure 216 further includes a spacer 208 and source/drain regions 210. Each spacer 208 is formed on the sidewall of the corresponding gate 204. The spacers 208 include silicon oxide, silicon nitride or a combination thereof. The source/drain regions 210 are formed in the substrate 200 between the gate structures 216, and two adjacent gate structures 216 share one source/drain 210. Besides, the source/drain regions 210 can be combination of P-type doped regions and SiGe layers, or combination of N-type doped regions and SiC or SiP layers.

Continue referring to FIG. 2, the substrate 200 further has a contact etch stop layer (CESL) 212, a dielectric layer 214, and a dielectric layer 218 formed thereon. The CESL 212 and the dielectric layer 214 fill up the gaps between the gate structures 216 but expose the tops of the gate structures 216. Specifically, the CESL 212 is formed to cover the top surfaces of the source/drain regions 210 and the sidewalls of the spacers 208, and the dielectric layer 214 is formed on the CESL 212 to fill up the gaps between the gate structures 216. Besides, the dielectric layer 218 is formed to cover the tops of the gate structures 216. The CESL 212 includes silicon nitride or a suitable insulating material. Each of the dielectric layer 214 and the dielectric layer 218 includes silicon oxide, a low-k material, a suitable insulating material or a combination thereof. The material of the dielectric layer 214 can be the same as or different from that of the dielectric layer 218.

Thereafter, the process steps similar to those as described in FIGS. 1B to 1H are implemented, so as to obtain a planar device including a metal gate or a silicon-containing gate. Eventually, the contact holes (not shown) are formed in the dielectric layer 214.

The first and second embodiments in which the target layer to be patterned includes the silicon oxide dielectric layers 118 and 114 and is formed on the substrate 100/200 covering the gate structures 116/216 is provided for illustration purposes, and is not construed as limiting the present invention. In another embodiment, the target layer can include another dielectric material (e.g. silicon nitride or silicon oxynitride), a conductive material (e.g. polysilicon or metal) or a combination thereof.

In summary, in the patterning method (e.g. 2P2E approach) of the invention, a tri-layer hard mask and two tri-layer photoresists are provided for patterning the target layer. Herein, the tri-layer hard mask is configured to provide an unexpected effect. On one hand, the upper two layers of the tri-layer hard mask have different etching selectivities, so that the tri-layer hard mask can provide good shielding for the underlying components during the 2P2E approach. On the other hand, the lowest amorphous carbon layer of the tri-layer hard mask can be easily removed through a dry etching process, so that the tri-layer hard mask would not remain after the desired patterns (e.g. contact holes) are defined.

With such method, even though a rework of the second photolithography step occurs, the film stack of the invention can provide enough protection for the underlying layers. Specifically, in the present invention, all the components (including SiGe source/drains) are protected by at least a portion of the tri-layer hard mask after the first etching step, and therefore free of any possible damage during the rework. In other words, the conventional SiGe loss during the rework of the second photolithography step is not observed, so that the device performance can be accordingly improved.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A patterning method, comprising:
sequentially forming a mask composite layer and a first tri-layer photoresist on a target layer, wherein the mask composite layer comprises, from bottom to top, an amorphous carbon layer, a first mask layer and a second mask layer, and an etching selectivity of the second mask layer is different from an etching selectivity of the first mask layer;
performing a first etching process to the mask composite layer by using the first tri-layer photoresist as a mask, so as to form at least one first opening pattern in the second mask layer of the mask composite layer;
removing the first tri-layer photoresist;
forming a second tri-layer photoresist on the mask composite layer;
performing a second etching process to the mask composite layer by using the second tri-layer photoresist as a mask, so as to form at least one second opening pattern in the second mask layer of the mask composite layer;
removing the second tri-layer photoresist;
patterning the amorphous carbon layer and the first mask layer by using the second mask layer as a mask, so as to form a patterned mask composite layer; and
patterning the target layer by using the patterned mask composite layer as a mask.

2. The patterning method of claim 1, wherein the target layer is a dielectric layer formed on a substrate covering a plurality of gate structures.

3. The patterning method of claim 2, wherein the step of patterning the target layer exposes a portion of source/drain regions between the gate structures.

4. The patterning method of claim 3, wherein the source/drain regions comprise SiGe.

5. The patterning method of claim 2, wherein the substrate is a bulk substrate.

6. The patterning method of claim 2, wherein the substrate is a substrate with fins extending in a first direction, and the gate structures cross the fins and extend in a second direction different from the first direction.

7. The method of claim 6, wherein the second direction is perpendicular to the first direction.

8. The patterning method of claim 1, wherein the first tri-layer photoresist is the same as the second tri-layer photoresist.

9. The patterning method of claim 8, wherein each of the first and second tri-layer photoresists comprises, from bottom to top, a lower photoresist, a Si-containing hard-mask bottom anti-reflection coating (SHB) layer and an upper photoresist.

10. The patterning method of claim 9, wherein each of the lower photoresist and the upper photoresist comprises a 436 nm photoresist, a 405 nm photoresist, a 365 nm photoresist, a 248 nm photoresist or a 193 nm photoresist.

11. The patterning method of claim 9, wherein the lower photoresist comprises a 365 nm photoresist, and the upper photoresist comprises a 193 nm photoresist.

12. The patterning method of claim 9, wherein the SHB layer comprises organosilicon polymer or polysilane.

13. The patterning method of claim 1, wherein the first tri-layer photoresist is different from the second tri-layer photoresist.

14. The patterning method of claim 1, wherein the first mask layer comprises silicon nitride and the second mask layer comprises silicon oxide.

15. The patterning method of claim 1, wherein the first mask layer comprises silicon oxide and the second mask layer comprises silicon nitride.

16. The patterning method of claim 1, wherein the step of patterning the amorphous carbon layer and the first mask layer and the step of patterning the target layer are preformed in the same process chamber.

17. The patterning method of claim 1, wherein the target layer comprises silicon oxide, silicon nitride, silicon oxynitride, polysilicon, metal or a combination thereof.

* * * * *